US007739481B1

(12) United States Patent
VanCourt (10) Patent No.: US 7,739,481 B1
(45) Date of Patent: Jun. 15, 2010

(54) PARALLELISM WITH VARIABLE PARTITIONING AND THREADING

(75) Inventor: Thomas David VanCourt, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 449 days.

(21) Appl. No.: 11/851,341

(22) Filed: Sep. 6, 2007

(51) Int. Cl.
*G06F 9/40* (2006.01)
(52) U.S. Cl. ........................................................ 712/15
(58) Field of Classification Search ........................ None
See application file for complete search history.

(56) References Cited

U.S. PATENT DOCUMENTS

| 4,008,462 | A | * | 2/1977 | Kanda | 711/213 |
|---|---|---|---|---|---|
| 4,459,666 | A | * | 7/1984 | Kruger | 712/248 |
| 4,759,010 | A | * | 7/1988 | Murata et al. | 370/379 |
| 5,127,092 | A | * | 6/1992 | Gupta et al. | 712/234 |
| 5,692,139 | A | * | 11/1997 | Slavenburg et al. | 710/316 |
| 5,812,808 | A | * | 9/1998 | Driker | 712/212 |
| 5,941,966 | A | * | 8/1999 | Gotze et al. | 710/105 |
| 6,460,067 | B1 | * | 10/2002 | Chaudhry et al. | 718/101 |
| 6,507,947 | B1 | * | 1/2003 | Schreiber et al. | 717/160 |
| 6,606,699 | B2 | * | 8/2003 | Pechanek et al. | 712/16 |
| 6,654,308 | B1 | * | 11/2003 | Carter | 365/189.14 |
| 7,079,583 | B2 | * | 7/2006 | Yoshioka et al. | 375/240.26 |
| 7,370,136 | B2 | * | 5/2008 | Dash | 711/4 |
| 2004/0068730 | A1 | * | 4/2004 | Miller et al. | 718/106 |
| 2005/0138327 | A1 | * | 6/2005 | Tabei | 712/24 |
| 2006/0242384 | A1 | * | 10/2006 | Ahmed et al. | 712/24 |

OTHER PUBLICATIONS

Wolfe, A., etal., A Variable Instruction Stream Extension to the VLIW Architecture, 1991, ACM, pp. 2-14.*
Philips, "An Introduction to Very-Long Instruction Word (VLIM) Computer Archtecture," Philips Semiconductors, pp. 1-11.

* cited by examiner

*Primary Examiner*—Eric Coleman
(74) *Attorney, Agent, or Firm*—Weaver Austin Villeneuve & Sampson LLP (57) ABSTRACT

A programmable device includes multiple function unit control memories connected to multiple sequencers through an address selection network. Sequencers are dynamically assigned to function unit control memories allowing intermediate level including statement level and control construct level parallelism. A programmable device can be partitioned by reassigning function unit control memories to different sequencers operable to execute Very Long Instruction Word (VLIW) instructions.

22 Claims, 12 Drawing Sheets

PARALLELISM WITH VARIABLE PARTITIONING AND THREADING

DESCRIPTION OF RELATED ART

The present disclosure relates to methods and apparatus for efficiently implementing parallelism with variable partitioning and threading.

Current programmable chips such as field programmable gate arrays (FPGAs) offer tens to thousands of multipliers, scratch registers, and other computing resources. However, the ability to use these resources effectively has not kept up with resource availability. In one example, compilers for high level languages (HLLs) can generate dozens of function units (FUs) for an application, and use standard compilation techniques for very long instruction words (VLIW) to provide gate level parallelism. However, there are limitations to using VLIW for gate level concurrency.

Other compilation schemes assume parallelism based on a fixed set of communicating threads of control. Fixed sets of FUs are allocated to each thread while allowing independent control flow decisions in each unit of parallelism. However, parallelism based on fixed sets of resources also has limitations. Consequently, it is desirable to provide improved methods and apparatus for parallelism.

OVERVIEW

A programmable device includes multiple function unit control memories connected to multiple sequencers through an address selection network. Sequencers are dynamically assigned to function unit control memories allowing intermediate level including statement level and control construct level parallelism. A programmable device can be partitioned by reassigning function unit control memories to different sequencers operable to execute Very Long Instruction Word (VLIW) instructions of potentially variable width.

In one embodiment, a device including multiple function unit control memories, an address selection network, and multiple sequencers is provided. The multiple function unit control memories are operable to provide resources on a programmable device for execution of a very long instruction word (VLIW). An address selection network is connected to the function unit control memories. Multiple sequencers are connected to the address selection network. The multiple sequencers are operable to receive control information from a plurality of code memories, one per sequencer. The first sequencer is connected to a first function unit control memory during a first cycle and the first sequencer is connected to a second function unit control memory during a second cycle.

In another embodiment, a technique is provided. A first function unit control memory on a programmable device is connected to a first sequencer and a second function unit control memory on the programmable device is connected to a second sequencer during a first cycle. The first function unit control memory and the second function unit control memory are operable to provide resources on the programmable device for execution of a very long instruction word (VLIW). An address selection network is modified to connect a first function unit control memory on the programmable device to the second sequencer during a second cycle. The first sequencer and the second sequencer are connected to first code memory and second code memory respectively.

These and other features of the present invention will be presented in more detail in the following specification of the invention and the accompanying figures, which illustrate by way of example the principles of the invention.

BRIEF DESCRIPTION OF THE DRAWINGS

The disclosure may best be understood by reference to the following description taken in conjunction with the accompanying drawings, which illustrate particular embodiments of the present invention.

DESCRIPTION OF PARTICULAR EMBODIMENTS

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of Very Long Instruction Words (VLIW). However, it should be noted that the techniques of the present invention can be applied to a number of variations to VLIW. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors can also be used while remaining within the scope of the present invention unless otherwise noted. Furthermore, the techniques and mechanisms of the present invention will sometimes describe two entities as being connected. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

Conventional mechanisms for providing parallelism are limited. Programmable devices such as field programmable gate arrays (FPGAs) offer numerous resources such as multipliers, scratch registers, multiplexers, etc, but these resources are often not used effectively for parallelism. In one example, function units such as adders, multipliers, and comparators can be allocated to implement fields of very long instruction words (VLIW) in parallel. An add operation based on some fields in the VLIW instruction can occur at the same time as a multiply operation based on some other fields in the VLIW instruction. In some instances, numerous function units may operate simultaneous to execute a particular VLIW instruction.

Having numerous function units operating on different fields of a VLIW instruction or different threads can work well for extremely regular computations. For example, if all fields in the VLIW correspond a thread or single arithmetic operation in a function unit, providing parallelism is relatively straightforward. It should be noted that terms such as thread, fork, join, and barrier are used descriptively herein. However, these terms are not being used to refer to operating system level, software, or other high-level forms of parallelism. Although some operational similarities exist, the terms are used herein to refer to low-level, gate level, operation, statement, and control construct parallelism.

The different fields or independent operations in a VLIW instruction may use conditional control operations. When conditional control operations such as if then statements are used, providing parallelism becomes more difficult. One program counter can not follow multiple different control branches. To overcome this obstacle, some function units such as individual adders and multipliers have been augmented with additional control logic. However, these augmented operations or predicated operations still only allow limited kinds of flexibility, and can underutilize available hardware if many no operations are introduced. This operation level parallelism is similar to single instruction multiple data (SIMD) architectures that allow a single operation to be applied to many data points simultaneously.

Other compilation schemes assume parallelism based on a fixed set of communicating threads of control. This allows completely independent control flow decisions in each unit of parallelism. For example, multiple blocks of FUs are separately assigned to different threads of control. The first drawback of this approach is that it generally allocates a fixed set of FUs to each thread, and loses use of those FUs when the thread is idle for any reason. The second problem is that the number of communicating threads is constant, and unable to adapt to different degrees of parallelism possible in different phases of one computation. Many conventional systems only provide parallelism at a course process level or at a very fine grained operation level.

In one example, fine grained operation based parallelism allows simultaneous processing of an add, a multiply, and a compare. Processes level parallelism allows simultaneous processing of a functional block. The process level parallelism does not allow much flexibility in resource allocation. The operation level parallelism does not provide robust support of control logic. However, the techniques of the present invention recognize that several other forms of hardware parallelism exist that are more fine grained than process parallelism but higher level than operation parallelism. These types of parallelism include statement parallelism and control construct parallelism. According to various embodiments, parallelism is provided at an intermediate level.

According to various embodiments, statement based parallelism allows simultaneous processing of add operations for i from 0 to 5 and add operations for j from 0 to 6. According to various embodiments, control construct parallelism allows simultaneous processing of add operations for i from 0 to 4 if j is 1 and add operations for 1 from 5 to 9 if j is 1.

Consequently, the techniques and mechanisms of the present invention provide the ability to create multiple independent threads of execution, each controlling a potentially large number of FUs. The number of threads can be varied at runtime, with communication overhead on the order of one machine cycle, and the distribution of FUs across concurrent threads can be adjusted at runtime with low overhead.

According to various embodiments, parallelism with variable partitioning on threading including Very Long Instruction Word (VLIW) with Variable Partitioning and Threading (VVPT) is provided. VVPT supports easy tailoring to each application, variable concurrency with low cost for synchronization, and runtime ability to shift computing resources between threads. Parallelism with variable partitioning and threading works particularly well on programmable chips because of the abundance of easily partitionable memory. Memory remains relatively expensive on devices such as Application Specific Integrated Circuits (ASICs).

Figure 1:
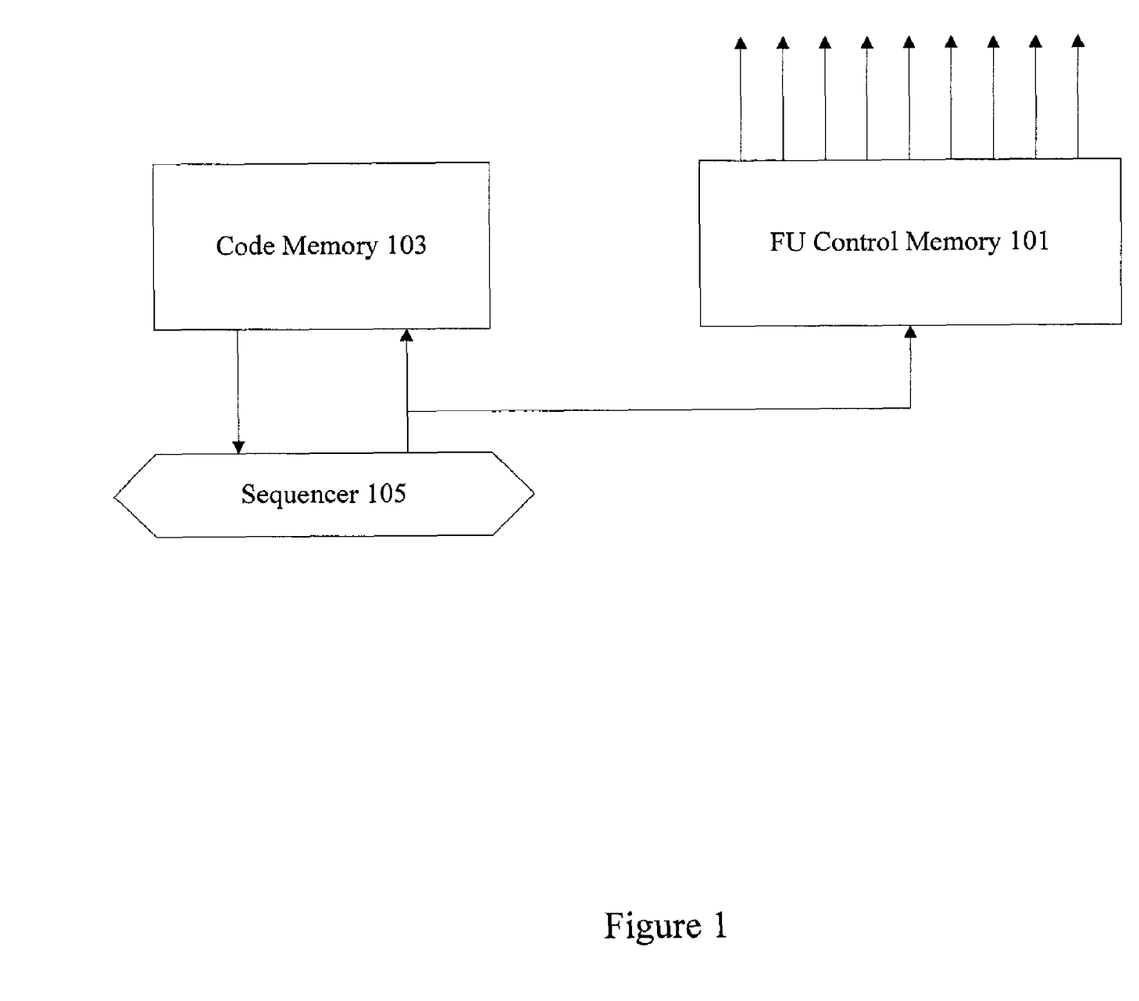
FIG. 1 illustrates a control construct including control memory, code memory, and a sequencer.

FIG. 1 illustrates the control subsystem of a typical microprogrammed VLIW system. Arithmetic data paths have been omitted for clarity, to allow focus on the control path. Code memory 103 includes control codes for sequencing logic. For example, control codes may include codes for determining which condition to test and what address to access. Code memory 103 provides control codes and/or instructions to a sequencer 105. In conventional implementations, a single sequencer 105 includes a single program counter. The single sequencer 105 and program counter coordinate operations for multiple, potentially hundreds of FU control fields in memory 101. In particular embodiments, the sequencer 105 uses addresses to access FU control memory 101.

An entire program store is treated as a monolithic structure. Within that single slab, logical subdivisions contain control codes for the sequencing logic, fields for controlling FUs, and other fields for other command and control features. Also, because the FPGA's block RAMs rarely provide the exact capacity and word width required, the one logical memory is typically a set of block RAMs concatenated to give the numbers of words and bits required. In fact, good design encapsulation might entail sequencer control fields and FU controls be implemented in different components even though they are driven by the same address values (as shown). In its basic form, however, the same addresses go to all fields of the memory.

Figure 2:
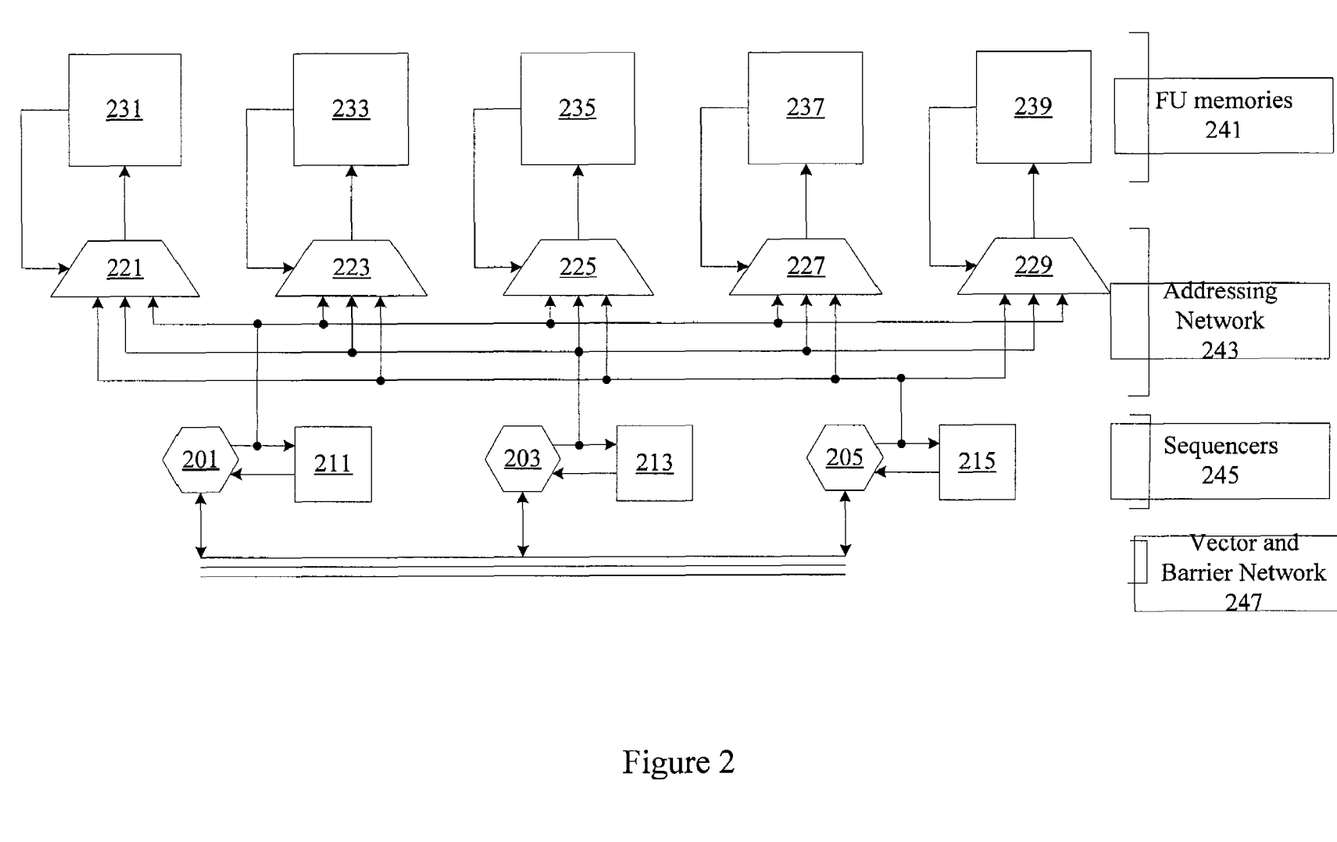
FIG. 2 illustrates one example of a variable partitioning and threading system.

FIG. 2 shows a VLIW control mechanism supporting variable partitioning and threading. The control mechanism includes FU control memories 241, an addressing network 243, sequencers 245, and a vector and barrier network 247. The FU control memories 241 include portions 231, 233, 235, 237, and 239. The FU control memories 241 are connected to sequencers 245 including 201, 203, and 205 through address network 243 including multiplexers 221, 223, 225, 227, and 229. The multiplexer 221, 223, 225, 227, and 229 allow various sequences to be interchangeably connected to various FU control memories. That is, various sequencers can control a dynamically configurable number of FUs. The sequencers 201, 203, and 205 are connected to code memories 211, 213, and 215. The sequencers 201, 203, and 205 can all operate simultaneously.

The vector and barrier network 247 includes control lines for connecting the sequencers 201, 203, and 205 to allow concurrent threads of execution to be started and synchronized. The vector and barrier network 247 may involve asserting individual bits associated with the various sequencers to allow lower-overhead dispatching and synchronization. The multiple sequencers allow parallelism corresponding to individual statements, control constructs, or loop iterations and allow different control flow in different threads. The amount of parallelism can vary dynamically at runtime, with reallocation of sets of function units across varying numbers of threads.

Figure 3:
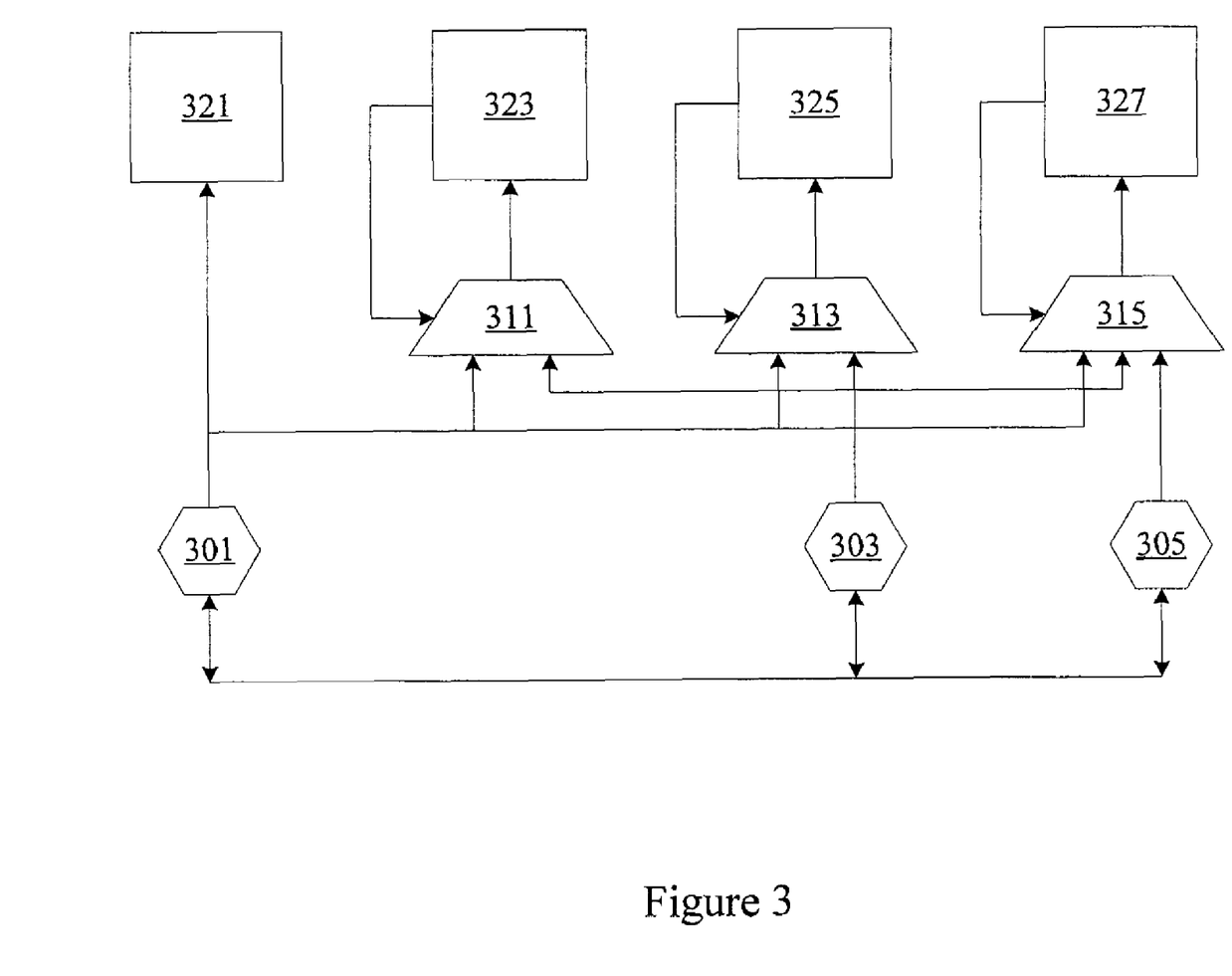
FIG. 3 illustrates another example of a variable partitioning and threading system.

FIG. 3 illustrates one example of a VVPT system. Although the VVPT structure is very general as an abstraction, it should be noted that each realized instance can be uniquely synthesized to meet the needs of a specific application. According to various embodiments, the system includes ten FUs (not shown), FU control memory 321, 323, 325, and 327, multiplexer 311, 313, and 315, and sequencers 301, 303, and 305. In particular embodiments, a code memory (not shown) is provided with each sequencer 301, 303, and 305. According to various embodiments, the structure has been synthesized specifically to handle a program including the following code sequence:

| (1)  | ...              | // Single-threaded setup   |
| (2)  | for i = 0 to 2 { | // Unrolled loop           |
| (3)  | if ( ... ) { ... } | // Loop body             |
| (4)  | else { ... }     |                            |
| (5)  | }                |                            |
| (6)  | ...              | // Single-threaded section |
| (7)  | for j = 1 to 2 { | // Unrolled loop           |
| (8)  | for k = 0 to j { ... } | // Non-unrolled loop |
| (9)  | }                |                            |
| (10) | ...              | // Single-threaded section |

According to various embodiments, VVPT control paths dynamically change to handle each phase of this program's execution. Numbers to the left of each step's description refer to line numbers in the code fragment above. If a sequencer is shown with no connections or with input connections only, it is assumed to be idle.

Figure 4A:
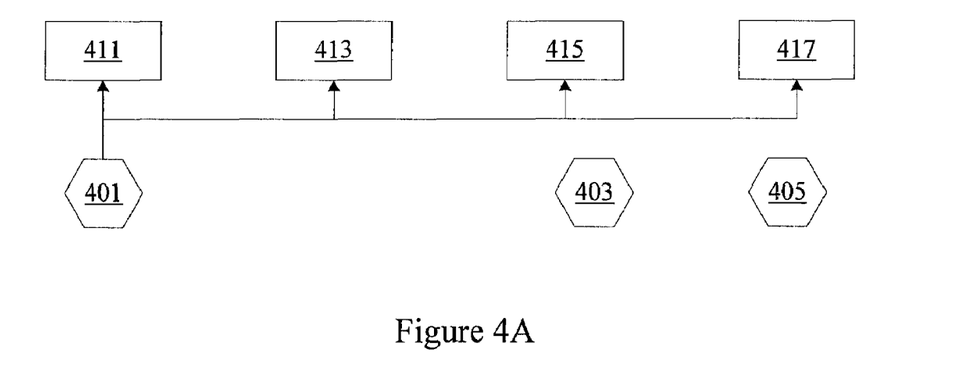
FIGS. 4A-4H are diagrammatic representations showing control path change.

FIG. 4A illustrates on example of a VVPT system at initialization. The system includes sequencers 401, 403, and 405 as well as FU control memory 411, 413, 415, and 417. Multiplexers connecting the sequencers to the FU control memory are not shown. At initialization, only sequencer 401 is active. Where address buses are multiplexed, address selection fields in each memory bank direct that bank to use address from sequencer 0. All FUs are available for computation.

Figure 4B:
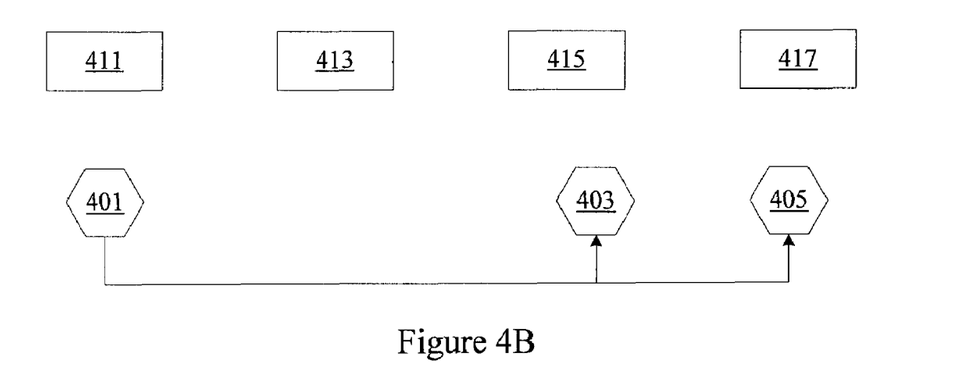

FIG. 4B illustrates the start of an unrolled loop, where the master thread starts up the other threads. The system includes sequencers 401, 403, and 405 as well as FU control memory 411, 413, 415, and 417. According to various embodiments, the unrolled loop (2) for i=0 to 2 includes branch controls that can not be evaluated at compile time. In order to parallelize instances of the loop body, each instance requires its own sequencer. Based on decisions made at synthesis time, some set of FUs has been assigned to each sequencer, for example three to sequencers 401 and 403, and four to sequencer 405. According to various embodiments, sequencers 403 and 405 have been idle up to this point, waiting to be assigned work to do. To start the parallel loop body executions, sequencer 401 transmits an integer value over the vector network, along with an indication of which set of sequencers must start execution at that vector address, in a manner similar to vectored interrupts in a microprocessor. Note that any number of threads can be started in a one-cycle operation. Program stores for sequencer 403 and sequencer 405 can contain different programs or different instances of the same program.

According to various embodiments, sequencers 401, 403, and 405 each execute an instance of the loop body. Each one has access to some subset of the FUs, granted through the address network. That subset does not change throughout this phase of parallel execution. Each sequencer can take as many or as few cycles as needed to execute its instance of the loop body, regardless of what is occurring in the other instances. Branching decisions are made independently.

Figure 4C:
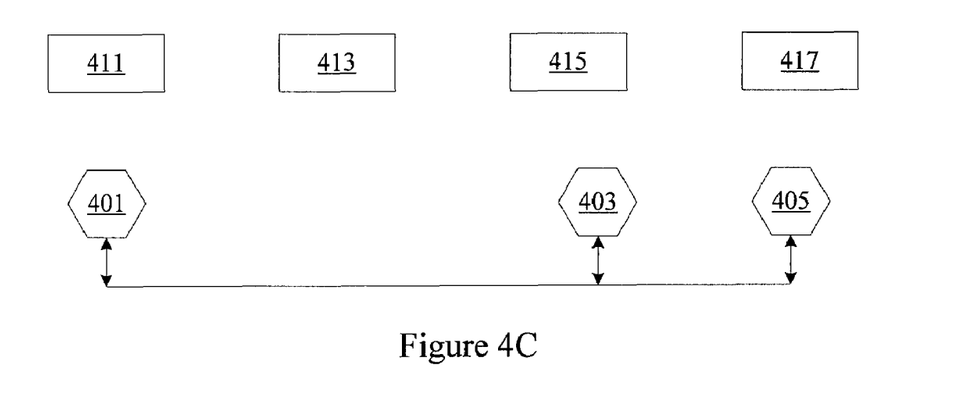

FIG. 4C illustrates sequencer synchronization. The threads in all three sequencers 401, 403, and 405 synchronize at the end of the loop by exchanging data over the barrier network. No sequencer proceeds until all sequencers have reached the barrier. Once all sequencers have reached the barrier, the program of sequencer 401 directs it to resume computation. Program store for sequencer 403 and sequencer 405 direct them to return to their idle state. Once all threads reach the barrier, execution resumes in all sequencers in the next cycle, or within a few cycles.

Figure 4D:
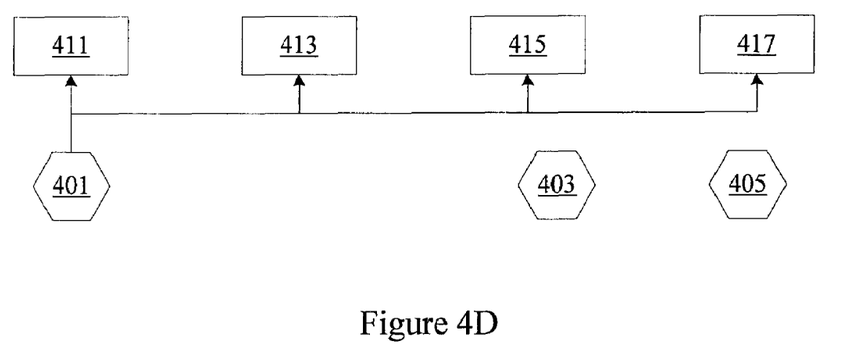

FIG. 4D illustrates sequencer idle operation. Sequencers 403 and 405 sit in their idle state, waiting for new work assignments. According to various embodiments, memory banks access the address of sequencer 401, so all of the FUs are available to the thread of sequencer 401 thread at this time. Sequencer 401 continues execution through the section in which multiple instruction streams are not needed.

Figure 4E:
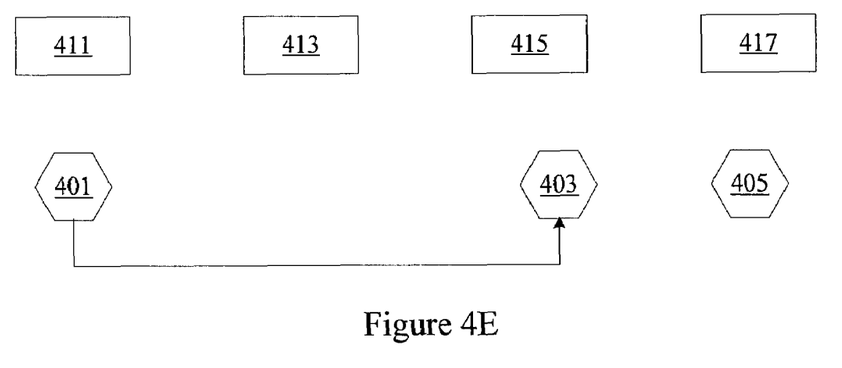

FIG. 4E illustrates reallocation of FU resources. As in loop (2), one thread is assigned to each of the two loop iterations. This time, sequencer 401 sends a command over the vector network to sequencer 403 but not sequencer 405. Only two threads are needed, so sequencer 405 is left idle. Because there are fewer threads, a larger portion of the system's total set of FUs can be allocated to each one, entailing different settings in the multiplexers in the address network. In this example, synthesis-time decisions assign five FUs to each sequencer for the duration of the parallel section.

Figure 4F:
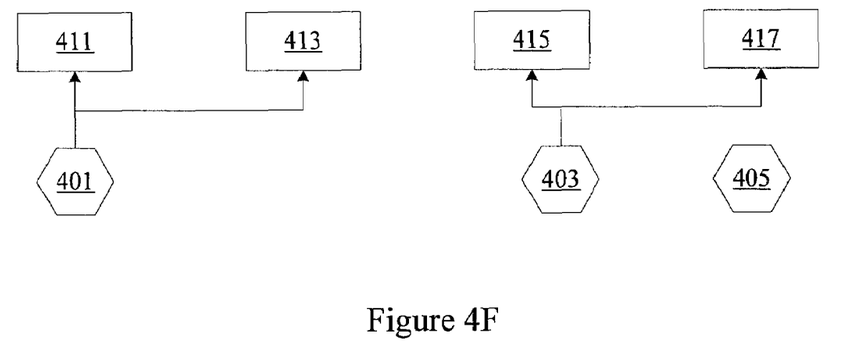
Figure 4G:
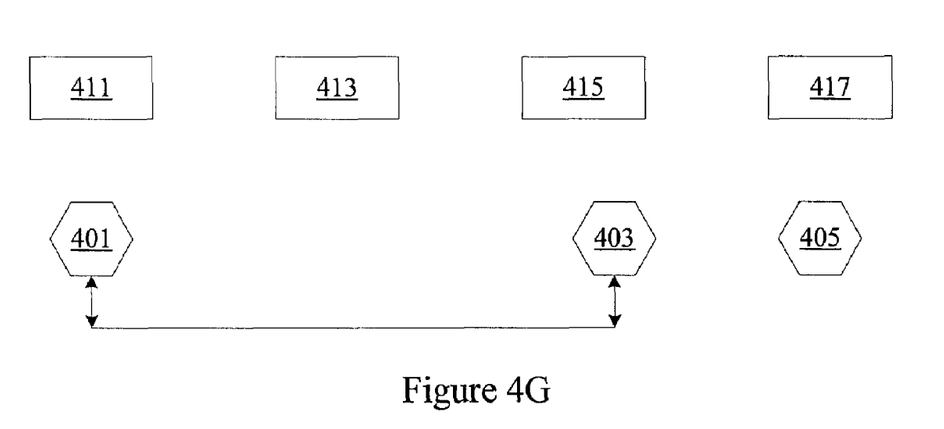
Figure 4H:
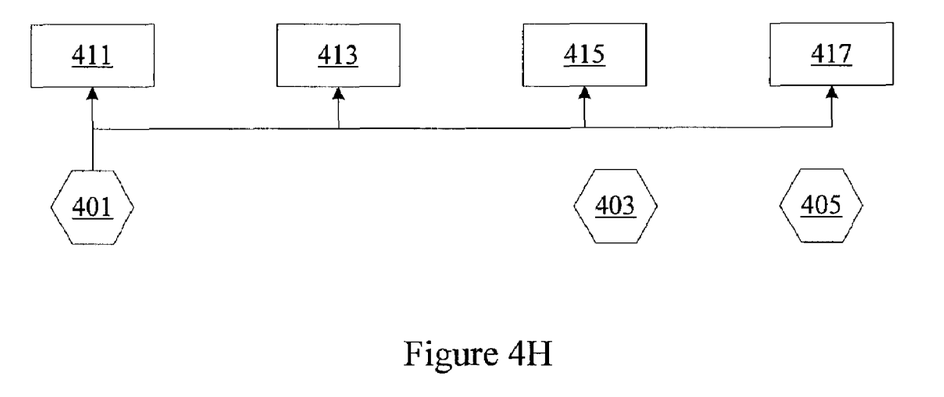

FIG. 4F illustrates unrolling of an inner loop. According to various embodiments, inner loops can be preserved while outer loops are unrolled. This allows the instances of the inner loops to run independently of each other, and does not require them to take the same number of cycles. In this case, sequencer 401 and sequencer 403 each execute a separate instance of the for k loop, possibly taking different numbers of cycles. FIG. 4G illustrates the end of the loop. At the end of loop (7), sequencers sequencer 401 and sequencer 403 synchronize with each other again by exchanging data through the barrier network. FIG. 4H illustrates another change in resource allocation. Sequencer 403 joins sequencer 405 in its idle state. Only sequencer 401 continues to execute, with free access to all of the FUs.

According to various embodiments, sequencer 401 is not substantially different from any other sequencer. It is assumed to run the master thread, the thread that initiates activity in all other threads, and that initiates (at least indirectly) all other threads. In particular embodiments, the VVPT architecture treats all sequencers as logically identical to each other. In practice, however, they will often differ in minor ways. Incidental differences can arise because of the circuit context of each sequencer and context-dependent synthesis. Deliberate differences could take advantage of knowing "slave" sequencers don't need the full feature set used by a sequencer assigned a "master" role.

VVPT sequencers can be implemented in simple logic. In one example, the sequencer is similar to a conventional microsequencer such as the Advanced Micro Devices (AMD)

2910. As a result, the concurrency model is extremely simple and heavily dependent on the compiler's use of two sequencer primitives.

According to various embodiments, a unit of concurrent execution is a "thread," a sequence of instructions executing on one of the sequencers. The number of active threads can vary over time, as different sequencers move between their active and idle states. One sequencer is taken to be the highest-level controller or "master", and is active as long as the VVPT engine is executing. In particular embodiments, the master is not significantly different from any other controller.

Thread-level concurrency is decided entirely at compile time. Threads and the FU resources assigned to them are bound to sequencers by the compiler. This means, in part, that the compiler ensures that the contents of the address routing fields of each FU memory are set so that address routing properly represents the allocation of FUs to threads. Although it is not strictly necessary to the VVPT abstraction or implementation, this is easiest to visualize by assuming that addresses in all sequencer code memories, all FU memories, and all address routing memories have the same layout. Specific addresses in code memory are statically associated with threads, so corresponding addresses in FU and routing memory automatically associate with the correct threads.

Figure 5:
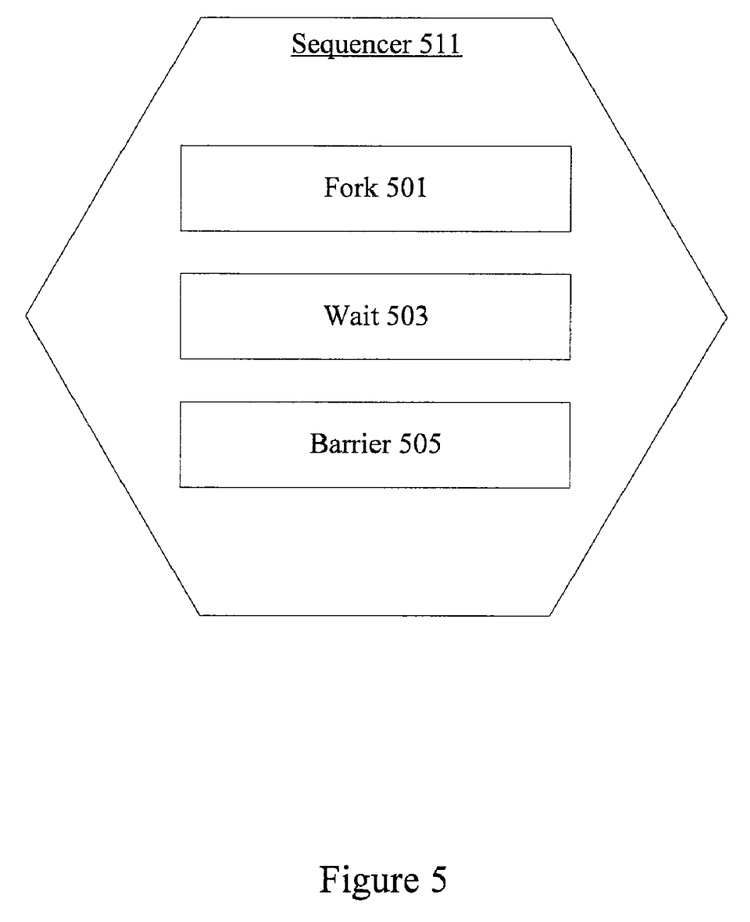
FIG. 5 is a diagrammatic representation showing one example of a sequencer.

FIG. 5 illustrates one example of a sequencer. According to various embodiments, simple sequencers includes instructions for conditional and unconditional branches while more complex sequencers can include subroutine calls or looping constructs based on hardware stacks for the sequencer's program counter. In particular embodiments, a sequencer also includes logic for a fork instruction 501, a wait instruction 503, and a barrier instruction 505. A fork instruction 501 is used by a master to initiate threads in slave processors. The fork instruction 501 includes two literal constant fields: one specifying which of its tasks a slave should initiate and the other specifying the set of slave processors that are to begin execution. According to various embodiments, a wait instruction 503 is used by idle slave sequencers and has no operands. It functions to keep the sequencer idle but receptive to fork commands from other processors.

A barrier instruction 505 is used to set a flag value visible to all of the other sequencers and waits for some set of other sequencers to execute barrier instructions of their own. The set of other sequencers is specified by a literal constant field in the instruction. Once all sequencers indicated by that constant have reached the barrier and set their respective barrier flags, all sequencers in that set clear their barrier flags and resume execution.

These instructions assume static scheduling of parallelism. In particular, the constant fields in the fork and barrier instructions imply that specific units of parallel work are assigned to specific sequencers at code generation time. The fork instruction assumes implicitly that any sequencer assigner a thread will begin executing that thread immediately; static scheduling eliminates the possibility of assigning work to a sequencer already executing some other thread. Contents of code memory for all sequencers in any VVPT system is expected to be generated at one time, with a high degree of coupling and implicit knowledge shared between the potentially different programs created for each sequencer.

Figure 6:
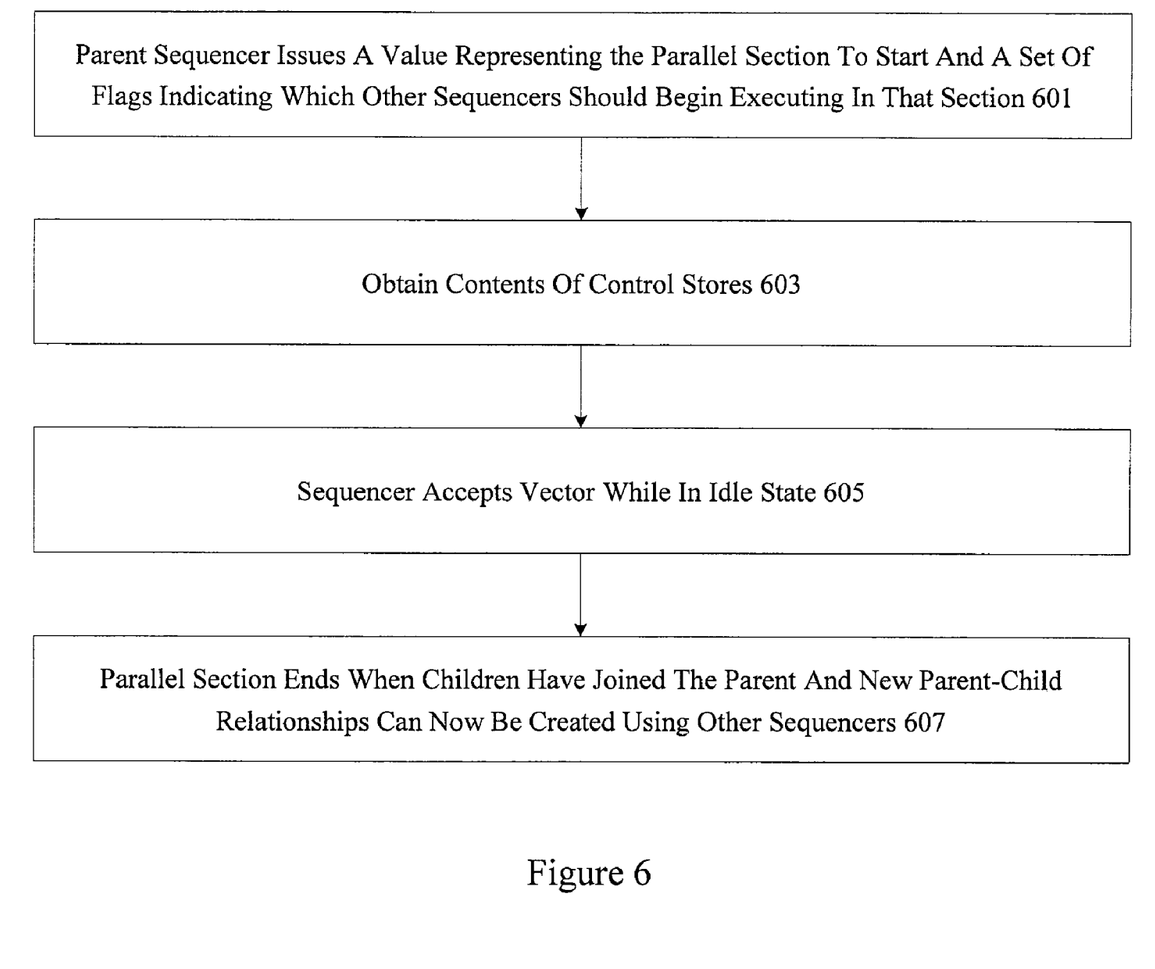
FIG. 6 illustrates one example of thread creation.

FIG. 6 illustrates a technique for creating threads. According to various embodiments, parallelism is based on a simple fork/join or co-begin/co-end model. In order to initiate parallel activity, a parent sequencer (not necessarily the master) at 601 issues an integer value representing the parallel section to start and a set of flags indicating which other sequencers (children) are to begin executing in that section. This allows multiple threads to be started in a single cycle. The integer value can be interpreted as one of the low addresses in the sequencers' code memory, so this resembles a vectored interrupt. Contents of all the code memories are obtained at 603, so the compiler ensures that the sequencers initiating and performing the concurrent activity have the same meanings for any given vector value. According to various embodiments, code generation happens at compile time, before the sequencer and control memories are loaded and before execution begins. In particular examples, the vector value selects between entry points in the code already present in the sequencer's control store. A sequencer accepts the vector at 605 when it is in its idle state. The compiler ensures that vectors are issued only to idle sequencers. Any sequencer can initiate parallel activity, allowing parallel regions to be nested. Parent and child roles last only as long as a particular concurrent activity, and are assigned at compile time. Once the children have joined the parent at 607, the relationship ends and new parent-child relationships can be created using other sequencers.

By convention, the compiler generates only properly nested sets of concurrent threads. Proper nesting means that if some thread forks other threads X1, X2, . . . and thread X1 forks other threads Y1, Y2, . . . , then all of the Y1 threads must join with X1 again before X1 can join with its sibling threads and parent. This is a matter of convention only, and not enforced by the hardware implementation. In practice, deeply nested families of parallel threads are expected to be rare.

Figure 7A:
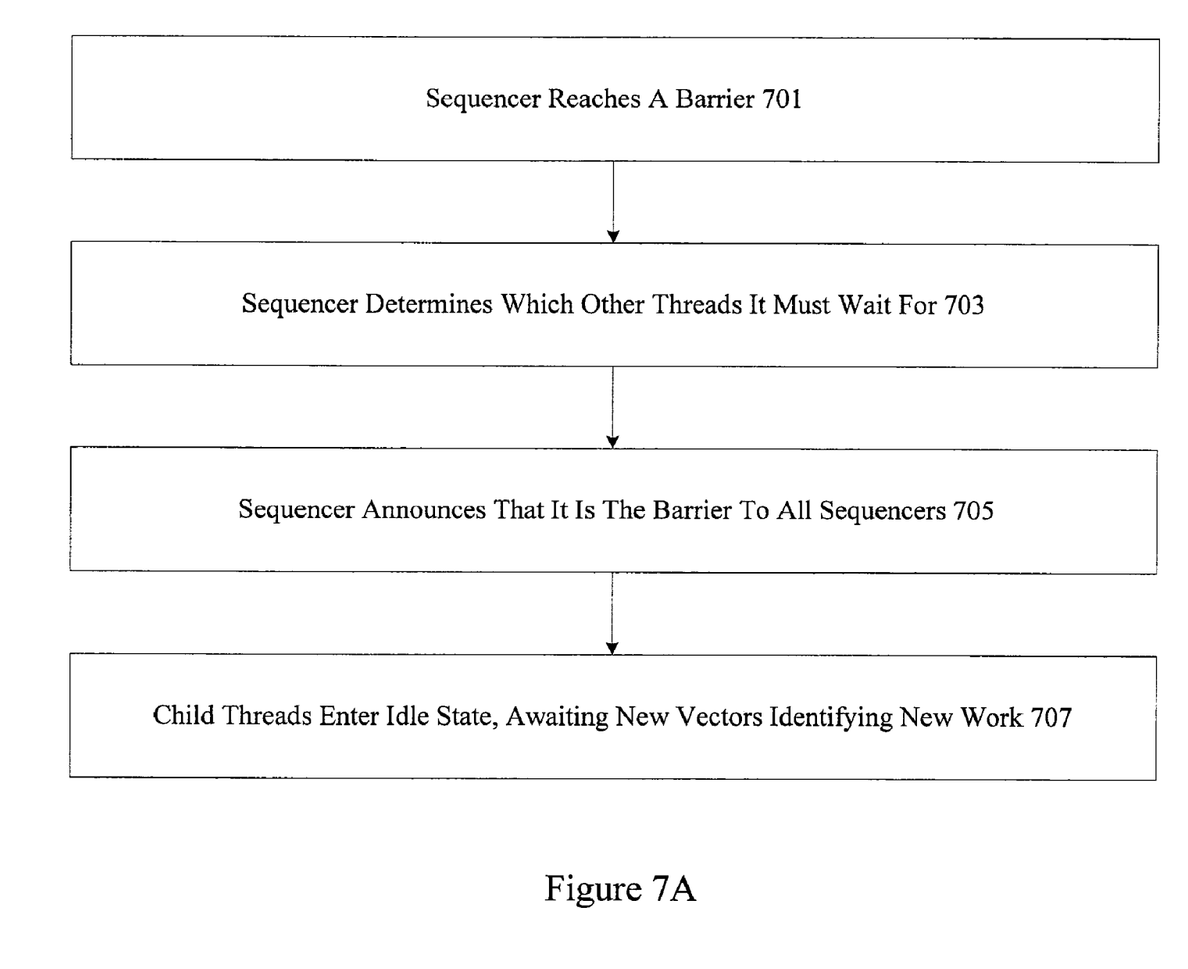
FIG. 7A illustrates one example of thread synchronization.

FIG. 7A illustrates one example of thread synchronization. According to various embodiments, barriers allow thread synchronization (e.g. the "join" operation). A barrier is a point at which some set of threads halt until all threads in the set have reached that point in their execution. When a sequencer reaches a barrier at 701, it does two things together. It decides which other threads it must wait for at 703, based on a literal constant in the barrier instruction, and it announces to all sequencers that it is at the barrier at 705. This affects only sequencers that are at a barrier and have chosen to listen to that particular sequencer.

In normal use, some sequencer (not necessarily the master) will have started a set of threads together. All threads in that set, including the parent that started the others, execute until they reach the barrier. Then every thread in that set looks for all other threads in that set to reach the barrier as well. Since the compiler statically decides which sequencer executes each thread, all threads that started concurrently know which sequencers are running threads in that parallel group, so know which sequencers to listen for in their barrier operation. A parent thread normally continues to execute once all of its children have met at the barrier. Child threads normally enter their idle state at 707, waiting for new vectors identifying new work. That is a matter or programming convention, as hardware allows any thread to resume execution after a barrier.

Concurrent barriers do not present any difficulty. Although a barrier has no explicit identity of its own, knowledge of the barrier is installed statically into each of the cooperating threads. Thus, threads A, B, and C can wait on each other at the same time that threads D, E, and F wait on each other without conflict.

According to various embodiments, a variety of optimizations can also be used. Efficient hardware implementation can take advantage of the specialized character of any particular instance of the VVPT architecture. In particular embodiments, only a single master sequencer is allowed to start other threads, simplifying the logic of other sequencers. The barrier network can also be modified when large numbers of sequencers are present, so that it is not necessary for every sequencer to have a barrier selection bit for every other sequencer. More words of code memory may be provided for the master sequencer than for the others, so that they can use smaller address busses and less on-chip memory for code memory. At the same time, the value emitted by a sequencer to FU memories need not be the sequencer's actual micro-address, but some value derived from that micro-address or a coded value held in code memory.

Furthermore, initiating parallel execution is described here in terms of a "push" model, where the parent issues a bitmask specifying which other sequencers are to begin executing new threads. If some set of sequencers always runs the same set of threads, then they can share the control line used to activate the sequencers. It is also possible to implement a "pull" model, in which the child sequencer knows which vector values to respond to. According to various embodiments, if two sequencers always run the same code in parallel threads, they can share a dual ported code memory. Some properly nested fork and join operations can also be combined in ways that violate proper nesting. This can reduce the number of control cycles needed, since each fork or join takes at least one cycle. This optimization affects the compiler only, and can be implemented using the fork and join primitives already described.

According to various embodiments, if a join operation applies to a set of threads in which an exact number of execution cycles is known for all threads, an actual barrier operation is not needed. Child threads can simply return to their idle state, and the parent can count off the known number of cycles needed for the longest-running child to finish. This eliminates the need for an actual barrier operation. Depending on details of the sequencer's internal pipeline, eliminating the barrier could reduce execution time by one or more cycles.

In addition, single-threaded operation, as described, runs one sequencer and idles all of the others. Instead, all sequencers can be run at all times. When emulating single-threaded behavior, all sequencers execute the same set of instructions at the same code addresses in lock-step manner. When running multi-threaded code, the set of sequencers is partitioned into one non-empty subset per thread, and all sequencers in any one subset (i.e., assigned to any one thread) execute identically until they join at a barrier. This eliminates the need for the vector network, since all sequencers would reach the fork operation at the same time and take responsibility for branching to the code representing for the thread to which each is assigned. This would also eliminate the need for the addressing network and routing memory, since sequencers would be assigned permanently to FU memories. In particular embodiments, the barrier network would still be used.

Figure 7B:
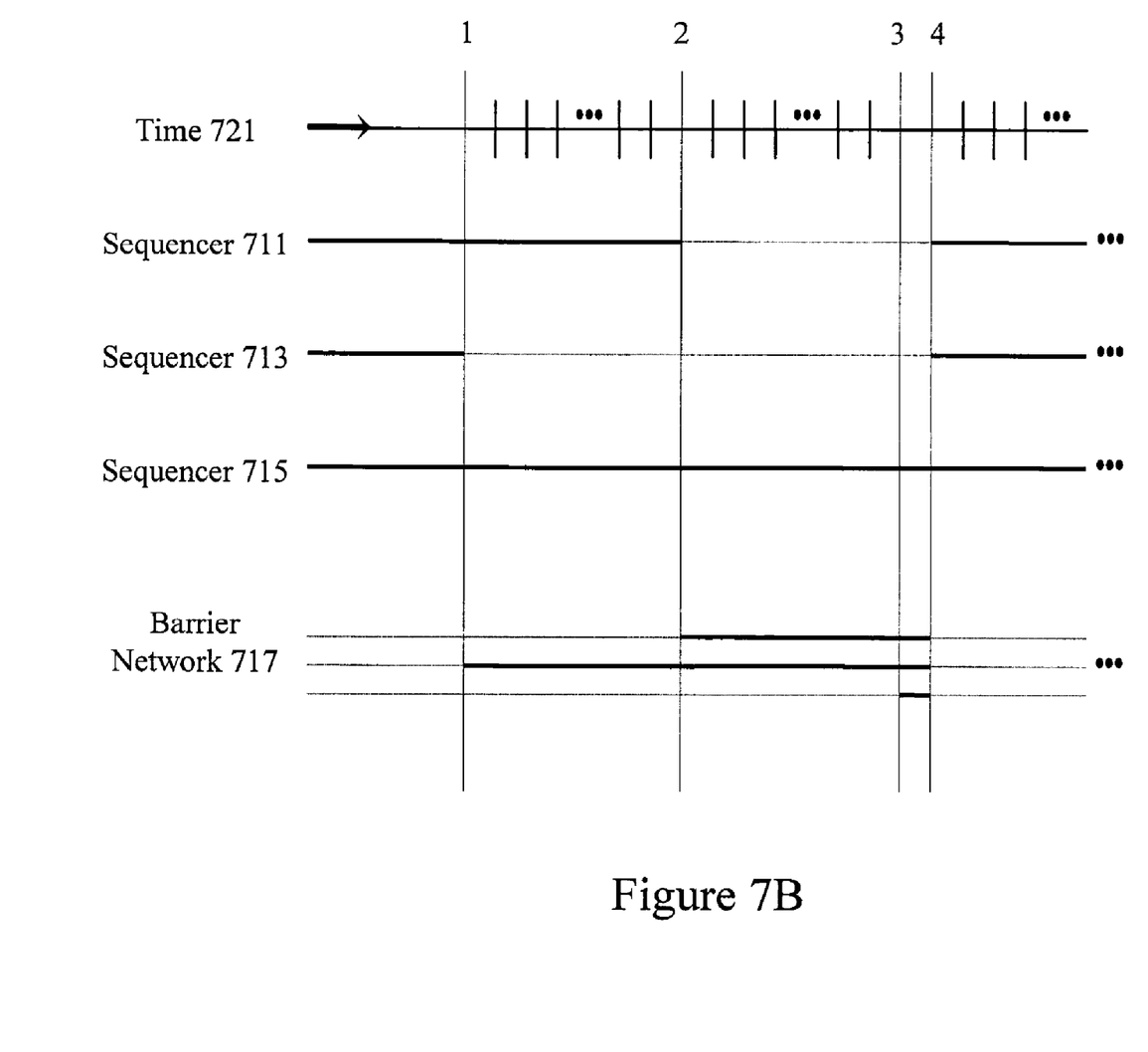
FIG. 7B illustrates one example of a barrier network.

FIG. 7B illustrates one example of a barrier network and illustrates behavior of three sequencers in one example system. Other sequencers, if any, are assumed not to interact with these sequencers during the period of interest and are not shown. The barrier network 717 contains one signal per sequencer, settable only by the sequencer to which it corresponds, but readable by all other sequencers.

Prior to time 1, all three sequencers execute independently of each other. At time 1, sequencer 713 executes its barrier instruction. It is not visible in the diagram, but this barrier instruction specifies that sequencer 713 will not resume until it receives signals from sequencers 711 and 715. The barrier instruction signals on the barrier network that sequencer 713 has halted and is ready to synchronize with any other sequencer[s].

At time 2, an unspecified amount of time later, sequencer 711 also executes a barrier. It also signals on the barrier network, and (not shown) waits for sequencers 713 and 715.

A sequencer passes its barrier only when it receives signals from all of the other sequencers specified in the barrier instruction. Even though sequencers 711 and 713 wait on each other and both are signaling on the barrier network, neither can proceed because both have specified that a signal from sequencer 715 must also be present.

At time 3, an unspecified amount of time later, sequencer 715 executes a barrier instruction. The barrier instruction signals on the barrier network, and (not shown) waits for sequencers 711 and 713. At this point, all three sequencers are signaling on the barrier network, and the continuation criteria for all three sequencers are met.

Time 4 represents the first moment at which it is possible for a sequencer to respond to its continuation criteria, typically the next machine cycle. Because sequencer 715 has continuation criteria already in effect at the time it executed the barrier instruction, it does not halt but continues execution immediately. Completion criteria for all three sequencers have been met, so all resume execution. Immediately upon resuming from the barrier instruction, each sequencer clears its signal from the barrier network.

In a typical application, sequencer 711 could be assigned the role of master. It resumes normal execution of its microprogram. Sequencers 713 and 715, acting as slaves, would typically enter an idle state and wait for work to be assigned over the vector network.

Rather than one signal per sequencer, other implementations are possible as well depending on the electronic features available in the hardware. For example, one signal could be shared by all sequencers participating in the barrier, using "wired-AND" logic to determine when all of the sequencers have signaled.

Figure 8:
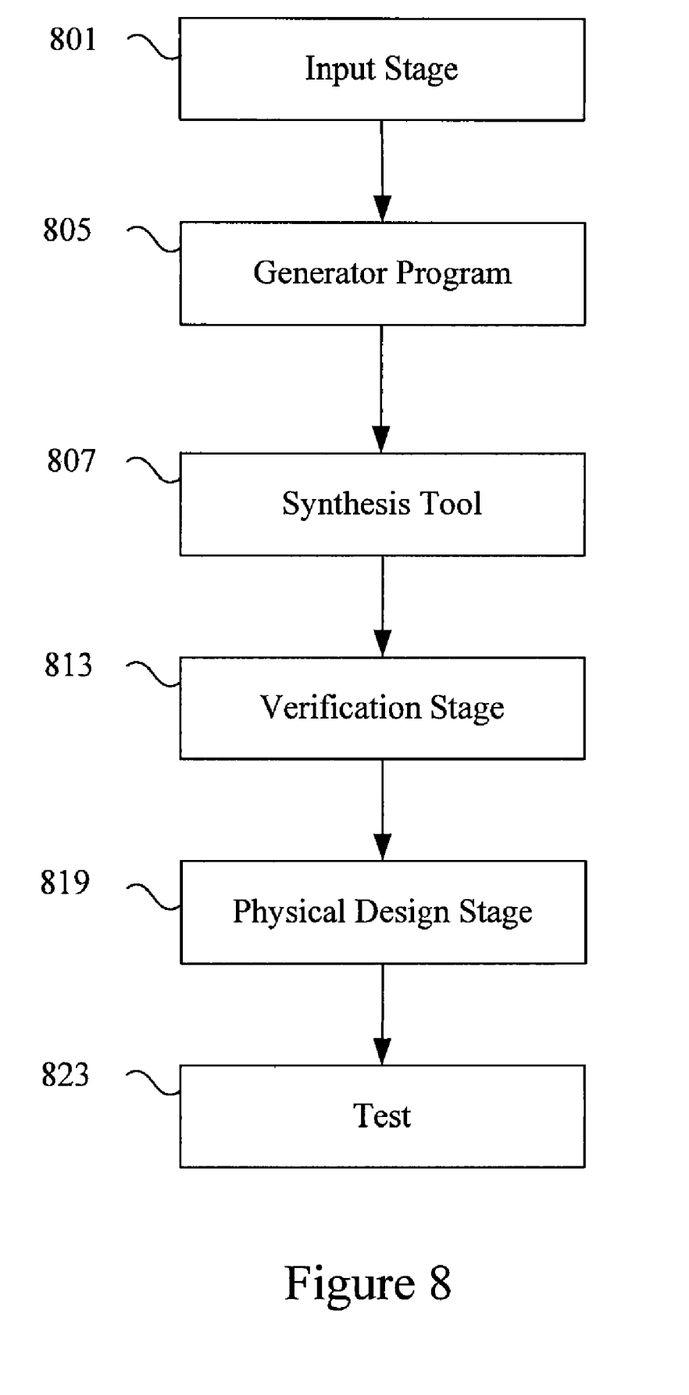
FIG. 8 is a diagrammatic representation showing a technique for implementing the programmable chip.

FIG. 8 is a diagrammatic representation showing implementation of an electronic device that can implement variable partitioning and threading according to various embodiments. An input stage 801 receives selection information typically from a user for logic such as a processor core as well as other components such as a streaming output device to be implemented on an electronic device. In one example, the input received is in the form of a high-level language program. A generator program 805 creates a logic description and provides the logic description along with other customized logic to any of a variety of synthesis tools, place and route programs, and logic configuration tools to allow a logic description to be implemented on an electronic device.

In one example, an input stage 801 often allows selection and parameterization of components to be used on an electronic device. The input stage 801 also allows configuration of variable or fixed latency support. In some examples, components provided to an input stage include intellectual property functions, megafunctions, and intellectual property cores. The input stage 801 may be a graphical user interface using wizards for allowing efficient or convenient entry of information. The input stage may also be a text interface or a program reading a data file such as a spreadsheet, database table, or schematic to acquire selection information. The input stage 801 produces an output containing information about the various modules selected.

In typical implementations, the generator program 805 can identify the selections and generate a logic description with information for implementing the various modules. The generator program 805 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 805 identifies pointers and provides ports for each pointer. One tool with generator program capabilities is System on a Programmable Chip (SOPC) Builder available from Altera Corporation of San Jose, Calif. The generator program 805 also provides information to a synthesis tool 807 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oregon and Synplify available from Synplicity Corporation of Sunnyvale, Calif. The HDL files may contain technology specific code readable only by a synthesis tool. The HDL files at this point may also be passed to a simulation tool 809.

As will be appreciated by one of skill in the art, the input stage 801, generator program 805, and synthesis tool 807 can be separate programs. The interface between the separate programs can be a database file, a log, or simply messages transmitted between the programs. For example, instead of writing a file to storage, the input stage 801 can send messages directly to the generator program 805 to allow the generator program to create a logic description. Similarly, the generator program can provide information directly to the synthesis tool instead of writing HDL files. Similarly, input stage 801, generator program 805, and synthesis tool 807 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 807.

A synthesis tool 807 can take HDL files and output EDF files. Tools for synthesis allow the implementation of the logic design on an electronic device. Some of the available synthesis tools are Leonardo Spectrum, available from Mentor Graphics Corporation of Wilsonville, Oregon and Synplify available from Synplicity Corporation of Sunnyvale, Calif. Various synthesized netlist formats will be appreciated by one of skill in the art.

A verification stage 813 typically follows the synthesis stage 807. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 813, the synthesized netlist file can be provided to physical design tools 819 including place and route and configuration tools. A place and route tool typically locates logic cells on specific logic elements of a target hardware device and connects wires between the inputs and outputs of the various logic elements in accordance with logic required to implement an electronic design. The device can also be physically tested at 823.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 801, the generator program 805, the synthesis tool 807, the verification tools 813, and physical design tools 819 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 9:
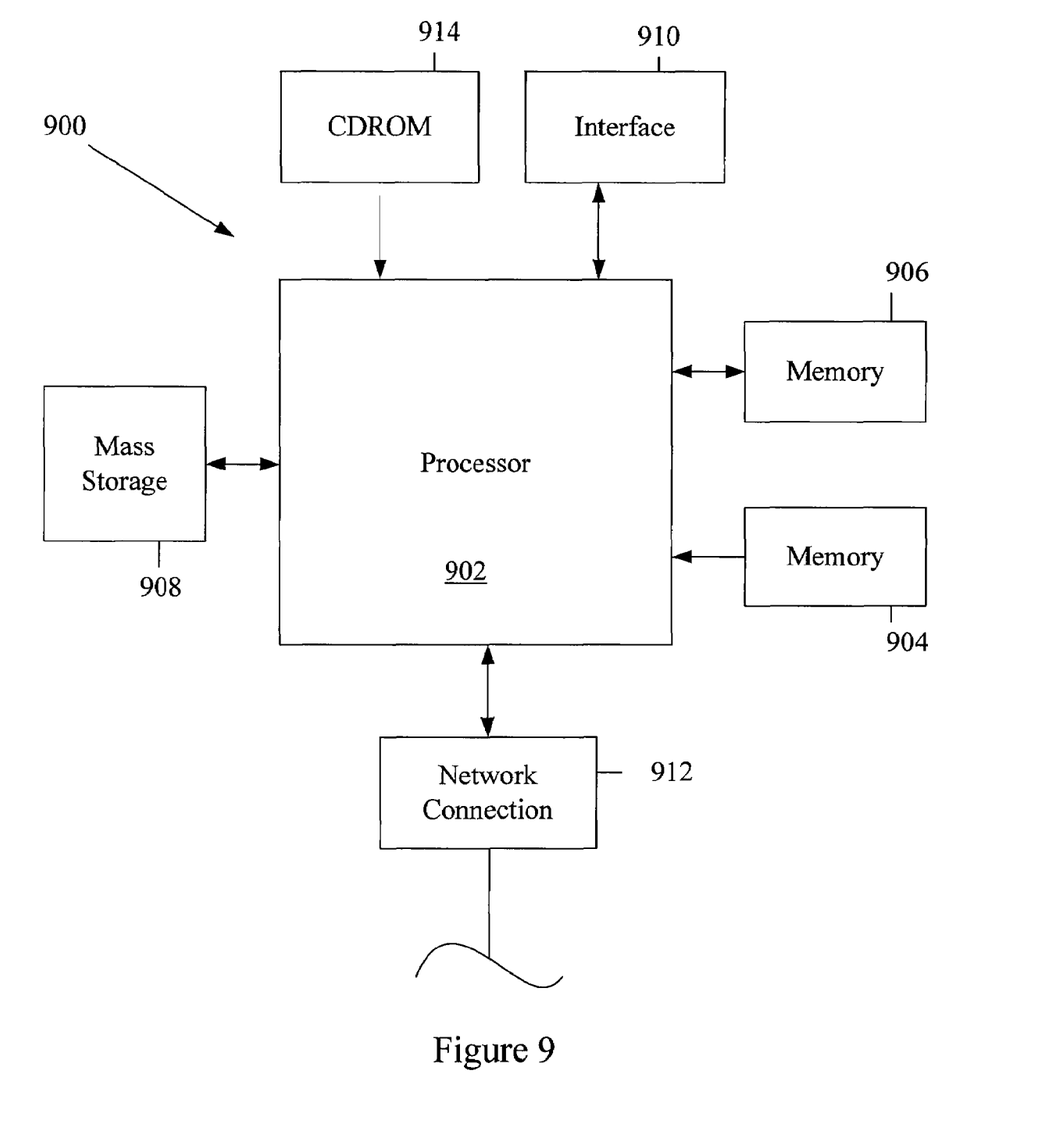
FIG. 9 is a diagrammatic representation depicting a computer system.

FIG. 9 is a diagrammatic representation showing a typical computer system that can be used to implement a programmable chip supporting parallelism with variable partitioning and threading. The computer system 900 includes any number of processors 902 (also referred to as central processing units, or CPUs) that are coupled to devices including memory 906 (typically a random access memory, or "RAM"), memory 904 (typically a read only memory, or "ROM"). The processors 902 can be configured to generate a test sequences for any designated processor. As is well known in the art, memory 904 acts to transfer data and instructions uni-directionally to the CPU and memory 906 is used typically to transfer data and instructions in a bi-directional manner.

Both of these memory devices may include any suitable type of the computer-readable media described above. A mass storage device 908 is also coupled bi-directionally to CPU 902 and provides additional data storage capacity and may include any of the computer-readable media described above. The mass storage device 908 may be used to store programs, data and the like and is typically a slave storage medium such as a hard disk that is slower than memory. The mass storage device 908 can be used to hold a library or database of prepackaged logic or intellectual property functions, as well as information on generating particular configurations. It will be appreciated that the information retained within the mass storage device 908, may, in appropriate cases, be incorporated in standard fashion as part of memory 906 as virtual memory. A specific mass storage device such as a CD-ROM 914 may also pass data uni-directionally to the CPU.

CPU 902 is also coupled to an interface 910 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 902 optionally may be coupled to a computer or telecommunications network using a network connection as shown generally at 912. With such a network connection, it is contemplated that the CPU might receive information from the network, or might output information to the network in the course of performing the above-described method steps. It should be noted that the system 900 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 908 or 914 and executed on CPU 908 in conjunction with master memory 906.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of master and slave components and should not be restricted to the ones mentioned above. Although shared I/O lines have been described in the context of a memory controller and a simultaneous multiple master component switch fabric, shared I/O lines can be used in a system without a memory controller and/or without a simultaneous multiple master component switch fabric. It is therefore intended that the invention be interpreted to include all variations and equivalents that fall within the true spirit and scope of the present invention.

What is claimed is:

1. A device, comprising:
   a plurality of function unit control memories operable to provide resources on a programmable device for execution of a very long instruction word (VLIW);
   an address selection network connected to the plurality of function unit control memories;
   a plurality of sequencers connected to the address selection network, the plurality of sequencers operable to receive control information from a plurality of code memories, wherein a first sequencer is connected to a first function unit control memory during a first cycle and the first sequencer is connected to a second function unit control memory during a second cycle.

2. The device of claim 1, wherein the first function unit control memory is associated with a first plurality of function units.

3. The device of claim 2, wherein the second function unit control memory is associated with a second plurality of function units.

4. The device of claim 3, wherein the first plurality of function units include logic for performing add, multiply, and compare operations.

5. The device of claim 4, wherein the first plurality of function units and the second plurality of function units are distinct sets of resources.

6. The device of claim 1, wherein the plurality of code memories are associated with control path memory.

7. The device of claim 6, wherein the plurality of code memories provide control codes for sequencing logic.

8. The device of claim 1, wherein the address selection network comprises a plurality of multiplexers.

9. The device of claim 1, wherein each of the plurality of multiplexers corresponds to one of the plurality of function unit control memories.

10. The device of claim 1, wherein a second sequence is operable to control operation of the second function unit during the first cycle.

11. The device of claim 1, wherein the second sequencer is operable to control operation of a second function unit during the second cycle.

12. The device of claim 1, further comprising a vector and barrier network connected to the plurality of sequencers.

13. A method, comprising:
   connecting a first function unit control memory on a programmable device to a first sequencer and a second function unit control memory on the programmable device to a second sequencer during a first cycle, the first function unit control memory and the second function unit control memory operable to provide resources on the programmable device for execution of a very long instruction word (VLIW);
   modifying an address selection network to connect a first function unit control memory on the programmable device to the second sequencer during a second cycle, wherein the first sequencer and the second sequencer are connected to first code memory and second code memory respectively.

14. The method of claim 13, wherein the first function unit control memory is associated with a first plurality of function units.

15. The method of claim 14, wherein the second function unit control memory is associated with a second plurality of function units.

16. The method of claim 15, wherein the first plurality of function units include logic for performing add, multiply, and compare operations.

17. The method of claim 16, wherein the first plurality of function units and the second plurality of function units are distinct sets of resources.

18. The method of claim 13, wherein the first and second code memories are associated with control path memory.

19. The method of claim 18, wherein the first and second code memories provide control codes logic for sequencing logic.

20. The method of claim 13, wherein the address selection network comprises a plurality of multiplexers.

21. The method of claim 13, wherein each of the plurality of multiplexers corresponds to one of a plurality of function unit control memories.

22. An apparatus, comprising:
   means for connecting a first function unit control memory on a programmable device to a first sequencer and a second function unit control memory on the programmable device to a second sequencer during a first cycle, the first function unit control memory and the second function unit control memory operable to provide resources on the programmable device for execution of a very long instruction word (VLIW);
   means for modifying an address selection network to connect a first function unit control memory on the programmable device to the second sequencer during a second cycle, wherein the first sequencer and the second sequencer are connected to first code memory and second code memory respectively.

* * * * *